United States Patent
Otremba et al.

(10) Patent No.: US 9,230,880 B2
(45) Date of Patent: Jan. 5, 2016

(54) ELECTRONIC DEVICE AND METHOD FOR FABRICATING AN ELECTRONIC DEVICE

(71) Applicant: Infineon Technologies AG, Neubiberg (DE)

(72) Inventors: Ralf Otremba, Kaufbeuren (DE); Josef Hoeglauer, Heimstetten (DE); Juergen Schredl, Mering (DE); Teck Sim Lee, Melaka (MY); Xaver Schloegel, Sachsenkam (DE); Klaus Schiess, Allensbach (DE)

(73) Assignee: Infineon Technolgies AG, Neubiberg (DE)

( * ) Notice: Subject to any disclaimer, the term of this patent is extended or adjusted under 35 U.S.C. 154(b) by 0 days.

(21) Appl. No.: 14/165,754

(22) Filed: Jan. 28, 2014

(65) Prior Publication Data

US 2015/0214133 A1    Jul. 30, 2015

(51) Int. Cl.
  *H01L 23/495*    (2006.01)
  *H01L 23/40*    (2006.01)
  *H01L 21/3105*    (2006.01)
  *H01L 21/56*    (2006.01)
  *H01L 23/31*    (2006.01)
  *H01L 23/00*    (2006.01)
  *H01L 23/367*    (2006.01)
  *H01L 23/433*    (2006.01)

(52) U.S. Cl.
  CPC ...... *H01L 23/4006* (2013.01); *H01L 21/31053* (2013.01); *H01L 21/56* (2013.01); *H01L 23/3107* (2013.01); *H01L 23/367* (2013.01); *H01L 23/4093* (2013.01); *H01L 23/49548* (2013.01); *H01L 23/49562* (2013.01); *H01L 23/49568* (2013.01); *H01L 24/83* (2013.01); *H01L 23/4334* (2013.01); *H01L 2023/405* (2013.01); *H01L 2023/4031* (2013.01); *H01L 2023/4087* (2013.01); *H01L 2924/1305* (2013.01); *H01L 2924/1306* (2013.01)

(58) Field of Classification Search
  CPC .......... H01L 21/76254; H01L 21/76251; H01L 21/2007; H01L 21/187
  USPC .......... 257/666, 676, 692; 438/123, 455
  See application file for complete search history.

(56) References Cited

U.S. PATENT DOCUMENTS

| | | | |
|---|---|---|---|
| 6,404,041 B1 | 6/2002 | Gantioler et al. | |
| 6,496,373 B1 * | 12/2002 | Chung | 361/705 |
| 2008/0054449 A1 | 3/2008 | Hirler et al. | |
| 2009/0001562 A1 * | 1/2009 | Otremba et al. | 257/723 |
| 2010/0078784 A1 * | 4/2010 | Otremba | 257/676 |
| 2010/0187678 A1 * | 7/2010 | Kajiwara et al. | 257/692 |

FOREIGN PATENT DOCUMENTS

DE    19806817 C1    7/1999

* cited by examiner

*Primary Examiner* — Phuc Dang
(74) *Attorney, Agent, or Firm* — Murphy, Bilak & Homiller, PLLC

(57) ABSTRACT

An electronic device includes a semiconductor chip including an electrode, a substrate element and a contact element connecting the electrode to the substrate element. The electronic device further includes an encapsulant configured to leave the contact element at least partially exposed such that a heatsink may be connected to the contact element.

20 Claims, 7 Drawing Sheets

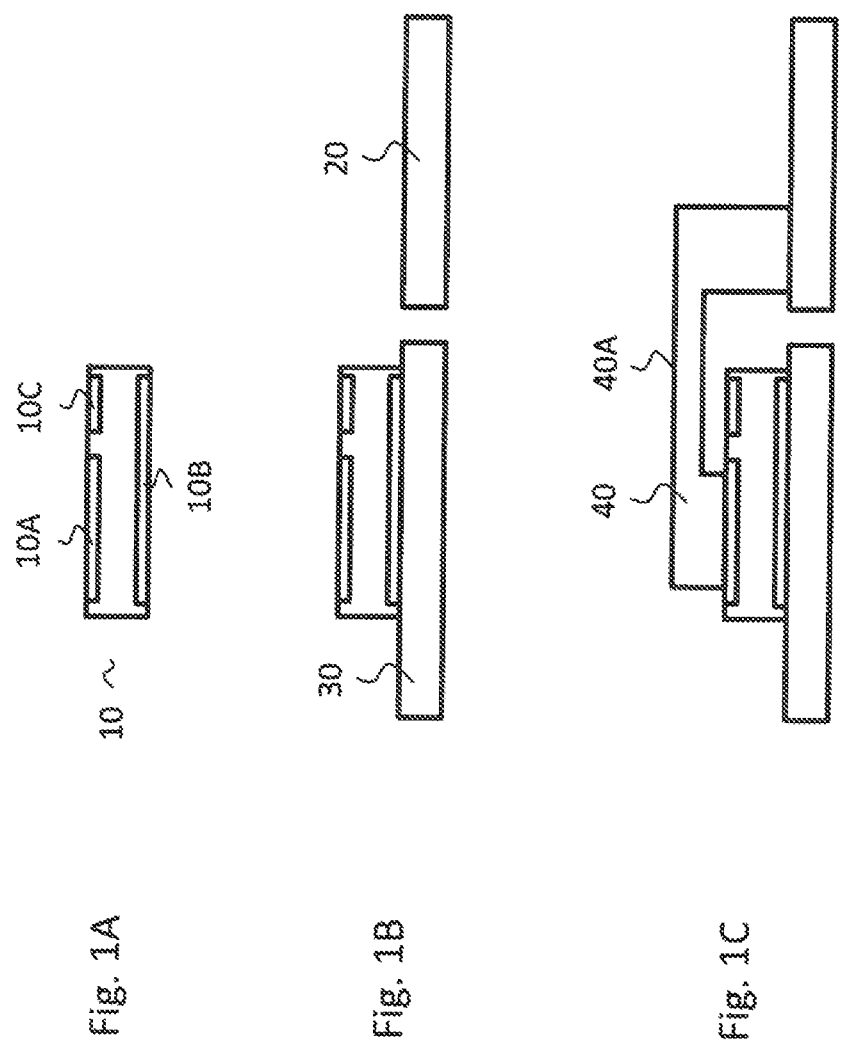

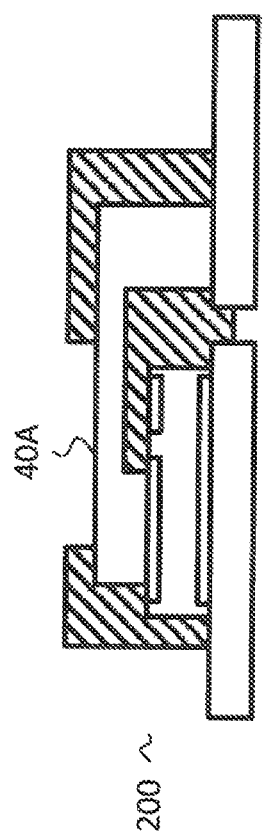

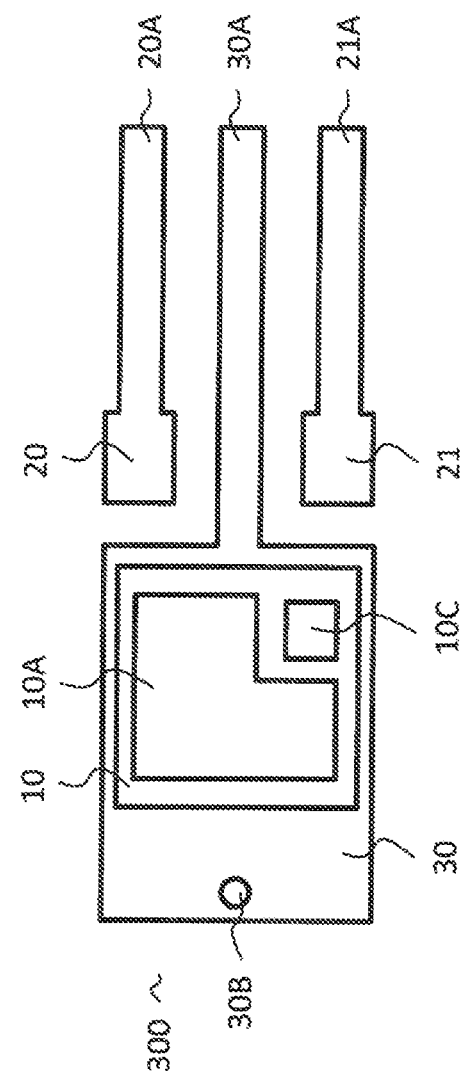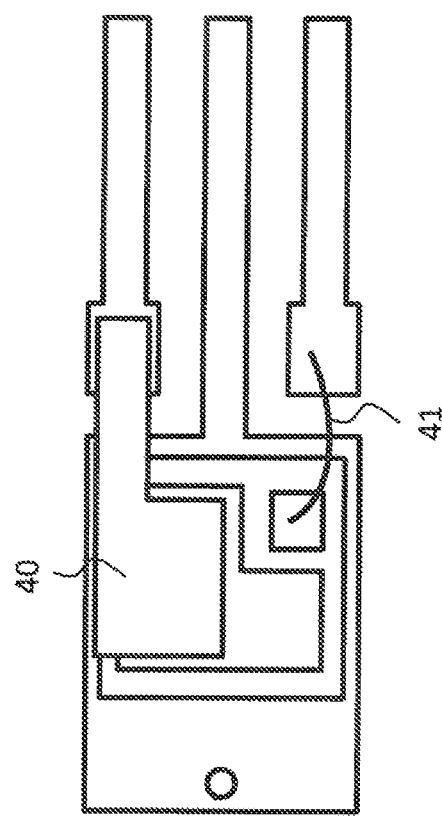
Fig. 3A
Fig. 3B

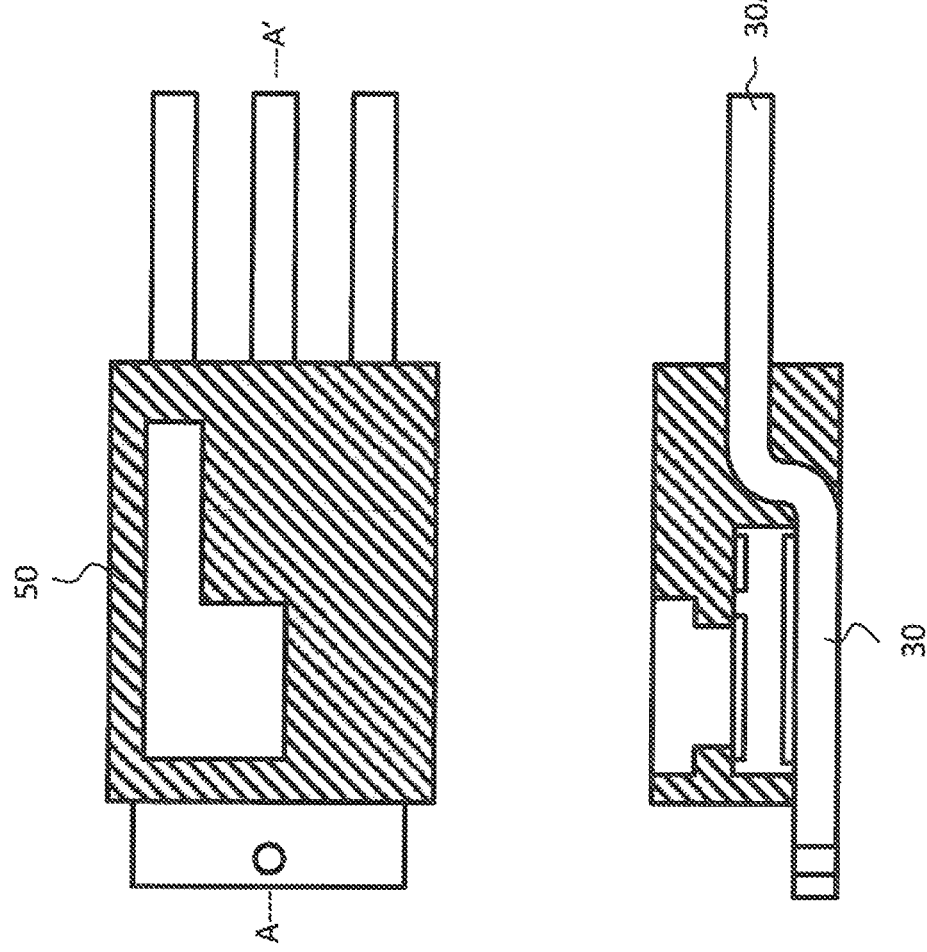

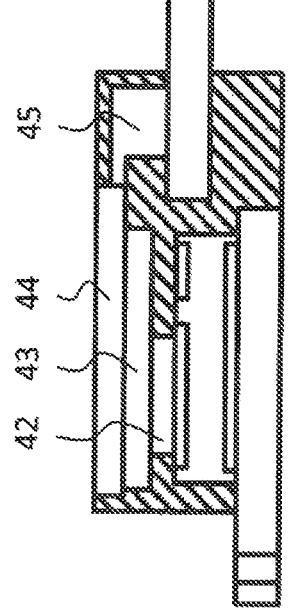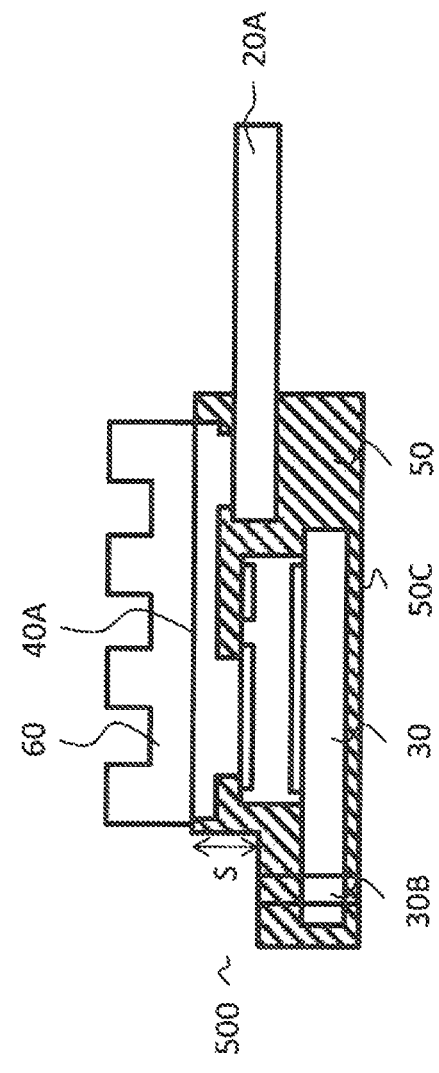

ELECTRONIC DEVICE AND METHOD FOR FABRICATING AN ELECTRONIC DEVICE

TECHNICAL FIELD

The present invention relates to an electronic device and a method for fabricating an electronic device.

BACKGROUND

An electronic device comprising a semiconductor chip may exhibit a parasitic source- or emitter-inductance and a parasitic drain- or collector-inductance. The source-/emitter-inductance may be much more critical than the drain-/collector-inductance. Reducing a parasitic inductance may improve an efficiency of the electronic device.

For these and other reasons there is a need for the present invention.

BRIEF DESCRIPTION OF THE DRAWINGS

FIGS. 1A-1F show an embodiment of an electronic device in cross-sectional view.

FIG. 2 shows a further embodiment of an electronic device in cross-sectional view.

FIGS. 3A-3D show a further embodiment of an electronic device. FIGS. 3A-3C show a top-view and FIG. 3D shows a cross-sectional view.

FIG. 4 shows an embodiment of an electronic device in cross-sectional view.

FIG. 5 shows an embodiment of an electronic device in cross-sectional view.

DESCRIPTION OF EMBODIMENTS

Figure 1D:
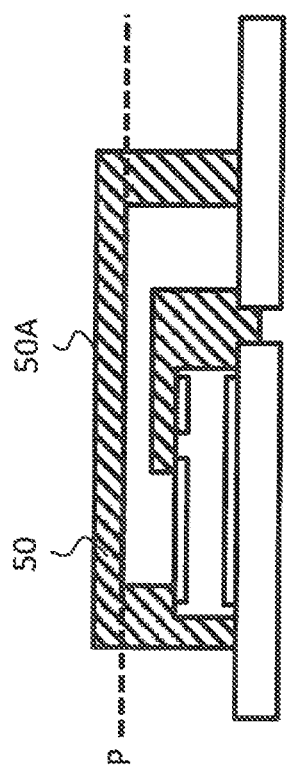

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The embodiments of an electronic device and a method for fabricating an electronic device may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chip(s) considered herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. Byway of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used which result in inter-metallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip(s) may comprise a diffusion barrier. The diffusion barrier prevents in case of diffusion soldering that the solder material diffuses from the carrier into the semiconductor chip(s). A thin titanium layer on the contact element may, for example, effect such a diffusion barrier.

Bonding the semiconductor chip(s) to the carrier may e.g. be done by soldering, gluing, or sintering. In case the semiconductor chip(s) are attached by soldering, a soft solder material or, in particular, a solder material capable of forming diffusion solder bonds may be used, for example a solder material comprising one or more metal materials selected from the group of Sn, SnAg, SnAu, SnCu, In, InAg, InCu and InAu.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any appropriate plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

In the following description and claims different embodiments of a method for fabricating an electronic device are described as a particular sequence of processes or measures, in particular in a flow diagram. It is to be noted that the embodiments should not be limited to the particular sequence described. Particular ones or all of different processes or measures can also be conducted simultaneously or in any other useful and appropriate sequence.

The electronic devices described below may be throughhole electronic devices, which may be configured for mounting on a Printed Circuit Board (PCB). In particular, the electronic devices described below may be counted among transistor outlines like, for example TO-220 or TO-247.

Embodiments of an electronic device may comprise a semiconductor chip comprising a first electrode, which may be a source electrode on a first surface and a second electrode, which may be a drain electrode on a second surface opposite the first surface of the semiconductor chip. The semiconductor chip may be placed on a substrate element, which may also be called a carrier such that the second electrode is electrically connected to the carrier. The carrier may be a leadframe in some embodiments. The side of an electronic device comprising the carrier may be called the backside and the side opposite the backside may be called the front-side of the electronic device.

In some embodiments the first electrode may be an emitter electrode and the second electrode may be a collector electrode.

Embodiments of an electronic device may further comprise a heatsink, wherein the heatsink may be configured to emit heat produced during normal operation of the semiconductor chip, in particular in embodiments wherein the semiconductor chip is a power semiconductor chip. The heatsink may be connected to the first electrode (source or emitter electrode) of the semiconductor chip. Connecting the heatsink to the first electrode instead of to the second electrode (drain or collector electrode) and the carrier may improve an efficiency of the electronic device.

The heatsink may be connected to the first electrode via a contact element configured to electrically connect the first electrode to an outside contact of the electronic device. The heatsink may be thermally and electrically connected to the contact element, or an electrical insulation may be used in order to only thermally but not electrically connect the heatsink to the contact element.

Embodiments of an electronic device may comprise an encapsulation material or encapsulant configured to encapsulate the semiconductor chip. In order to connect the heatsink to the contact element the encapsulant may be configured such that the contact element is at least partially exposed.

Herein an "exposed" part is a part that is not enclosed and which is thus accessible from the outside. According to some embodiments this is achieved by first applying the encapsulant such that the contact element is completely encapsulated and then applying a structuring step to the encapsulant. The structuring step may, for example comprise a grinding step. Grinding may be done using techniques well known in the art. For example, grinding may comprise mechanically removing part of the encapsulant. According to other embodiments during the encapsulation step the encapsulant is applied such that at least part of the contact element is not covered by the encapsulant and remains exposed.

Connecting the heatsink to the contact element may be achieved using any appropriate means. It may, for example comprise applying a solder or an adhesive or screwing or clamping or any appropriate combination of these.

Embodiments of an electronic device may comprise an further element like, for example a second heatsink connected to the carrier.

With respect to FIGS. 1A-1F cross-section views of an embodiment of an electronic device 100 are shown. FIG. 1A shows a semiconductor chip 10 comprising a first electrode 10A on a first surface and a second electrode 10B on a second surface opposite the first surface. According to an embodiment the semiconductor chip 10 may further comprise a third electrode 10C on the first surface. According to an embodiment first electrode 10A may be a source electrode, second electrode 10B may be a drain electrode and third electrode 10C may be a gate electrode. According to another embodiment first electrode 10A may be a emitter electrode, second electrode 10B may be a collector electrode and third electrode 10C may be a base electrode.

With respect to FIG. 1B a first substrate element 20 and a second substrate element 30 are shown. The semiconductor chip 10 is placed on and mechanically fixed on the second substrate element 30 such that the second surface of the semiconductor chip faces the second substrate element 30. The second electrode 10B may be electrically connected to the second substrate. As already mentioned, the second substrate may be called a carrier and in particular may comprise a leadframe. The first substrate element 20 may comprise a first outside contact configured to electrically contact the first electrode 10A from the outside as described below. Conversely, the second substrate element 30 may comprise a second outside contact configured to electrically contact the second electrode 10B from the outside. Furthermore, the electronic device 100 may comprise a third outside contact configured to electrically contact the third electrode 10C. The first, second and third outside contacts may comprise leads configured for input in through-hole contacts of a PCB. Note that the first and second substrate elements need not necessarily lie in the same plane as depicted in FIG. 1B-1F. Rather, in some embodiments the first and substrate element may lie in a plane above or below the second substrate element as, for example shown in the embodiments in FIG. 3B-3D.

With respect to FIG. 1C a contact element 40 is shown. Contact element 40 is configured to electrically connect first electrode 10A to first substrate element 20. According to some embodiments contact element 40 may comprise a contact clip. Contact element 40 may comprise the same materials as first and second substrate elements 20, 30 and may in particular comprise copper. According to some embodiments contact element 40 is comprised of one single part and according to other embodiments contact element 40 may comprise several electrically connected parts. Note that the shape of contact element 40 may deviate from the simple schematic shape shown here. The shape may depend on the requirements of the particular embodiment. However, in some embodiments it may be advantageous for the contact element to have a flat surface 40A.

With respect to FIG. 1D an encapsulant 50 encapsulating the semiconductor chip 10, the contact element 40 and part of the first and second substrate elements 20, 30 is shown. According to an embodiment of a method for fabricating an electronic device the encapsulant 50 is structured such that the contact element 40 becomes at least partially exposed. In particular, the encapsulant 50 may be at least partially removed from surface 50A down to plane P such that at least part of surface 40A of contact element 40 becomes exposed. According to an embodiment exposing the surface 40A comprises grinding the encapsulant 50 from surface 50A down to plane P.

Figure 1E:
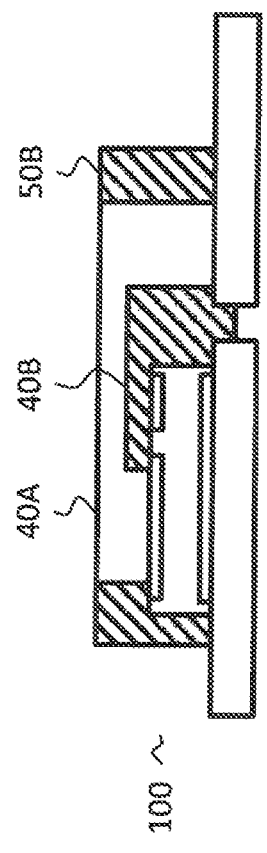

With respect to FIG. 1E an embodiment of an electronic device 100 with encapsulant surface 50B comprising an exposed contact clip surface 40A is shown. According to an embodiment the electronic device 100 shown here may be a product of the partial encapsulant removal described with respect to FIG. 1D. According to another embodiment no encapsulant removal step is necessary because the encapsulant is applied such that contact element surface 40A is never encapsulated. For example, a mask may be used to prevent contact element surface 40A from being encapsulated.

According to yet another embodiment semiconductor chip 10 and first and second substrate elements 20, 30 are provided. Then encapsulant 50 is applied to the semiconductor chip and the substrate elements. Afterwards encapsulant 50 is structured using appropriate micro-structuring techniques known in the art to fabricate a cavity in the encapsulant 50 in the shape of the contact element 40. Then the cavity is filled with electrically conductive material using techniques known in the art like plating techniques to fabricate the contact element 40. According to this embodiment the encapsulant 50 may comprise a laminate.

Note that contact element surface 40A need not necessarily be coplanar with encapsulant surface 50B. According to an embodiment contact element 40 sticks out of encapsulant surface 50B such that side faces of contact element 40 connecting surface 40A with opposite surface 40B are at least partially exposed. According to another embodiment surface 40A lies in a plane below surface 50B like in the embodiment 200 of an electronic device shown with respect to FIG. 2.

Figure 1F:
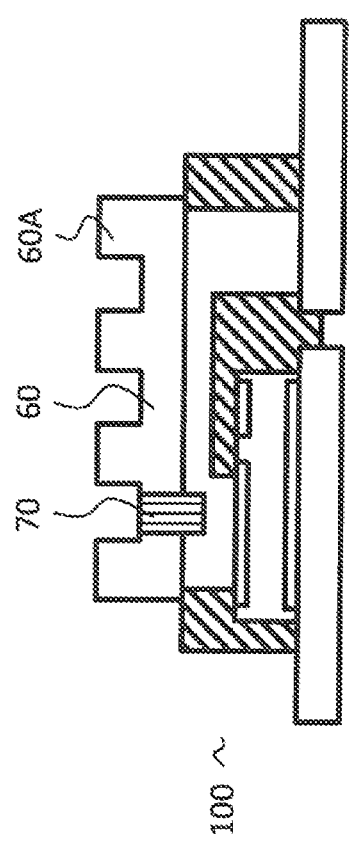

With respect to FIG. 1F an embodiment of an electronic device 100 is shown comprising a heatsink 60. According to an embodiment a fixture 70 is used to mechanically fix the heatsink 60 on the contact element 40. The fixture 70 may comprise a screw configured to fix the heatsink on the contact element. The fixture may be located above the first surface of the semiconductor chip 10 as shown in FIG. 1F. Alternatively, the fixture may be located in a region of the contact clip which does not lie above the first surface of the semiconductor chip 10. According to an embodiment an electrical insulation layer is applied between the contact element and the heatsink such that both are thermally but not electrically connected.

According to an embodiment a clamp is used to fix the heatsink on the contact element. The clamp may be used instead of the screw or together with the screw. Furthermore, one or more of adhesive and solder may be used to fix the heatsink 60 on the contact element 40. According to an embodiment one or more of adhesive and solder but no screw or no clamp or no screw and also no clamp is used.

The heatsink 60 may comprise cooling fins like cooling fins 60A schematically shown in FIG. 1F. The heatsink may comprise a metal like, for example copper or a metal alloy, in particular it may comprise the same materials as the contact element. The heatsink may have any appropriate dimensions and any appropriate shape. The contacts between the semiconductor chip 10 and the contact element 40 and between the contact element 40 and the heatsink 60 are configured such that heat may be efficiently transferred from the semiconductor chip and the contact element to the heatsink.

According to some embodiments the heatsink is partially covered by encapsulant 50. In one embodiment the heatsink is covered such that only the cooling fins 60A are exposed from the encapsulant.

With respect to FIG. 2 an embodiment of an electronic device 200 is shown. Electronic device 200 differs from electronic device 100 in the configuration of the encapsulant 50 such that only part of the surface 40A of contact element 40 is exposed. Still a heatsink may be attached such that it contacts the exposed part of the contact element. The encapsulant may comprise more than one opening exposing different parts of the contact element.

With respect to FIGS. 3A-3D exemplary stages of fabrication of an embodiment of an electronic device 300 are shown. Electronic device 300 may comprise identical parts as electronic device 100, which may be denoted with the same references. FIG. 3A shows a semiconductor chip 10 comprising a first electrode 10A and a third electrode 10C on a first surface. The semiconductor chip may further comprise a second electrode on a second surface opposite the first surface. Semiconductor chip 10 is arranged on a second substrate element 30 such that the second electrode is electrically connected to it. The second substrate element may comprise a second lead 30A and a montage hole 30B. Electronic device 300 further comprises a first substrate element 20 comprising a first lead 20A and a third substrate element 21 comprising a third lead 21A.

With respect to FIG. 3B a first contact element 40 and a second contact element 41 are shown. First contact element 40 is configured to electrically connect first electrode 10A to first substrate element 20. First contact element 40 may comprise a contact clip. Second contact element 41 is configured to electrically connect third electrode 10C to third substrate element 21. Second contact element 21 may comprise a bonding wire.

With respect to FIG. 3C an encapsulant 50 is shown. Encapsulant 50 may be configured to encapsulate semiconductor chip 10 and second contact element 41 as well as at least part of first, second and third substrate elements 20, 30, 21 and first contact element 40. As can be seen, at least part of first contact element upper surface 40A is exposed from encapsulant 50.

With respect to FIG. 3D a cross sectional view of electronic device 300 along the line A-A' in FIG. 3C is shown. Leads 20A, 30A and 21A need not be in the same plane as that part of second substrate element 30 whereupon semiconductor chip 10 is mounted.

With respect to FIG. 4 an embodiment of a semiconductor device 400 is shown. Semiconductor device 400 comprises a contact clip comprising multiple parts 42-45. According to an embodiment one or more than one or all parts 42-45 are fabricated by plating. According to an embodiment parts 42-45 are fabricated after encapsulation with encapsulant 50 and subsequent micro-structuring of encapsulant 50. According to another embodiment parts 42-45 are fabricated before encapsulation. Parts 42-45 may comprise the same material or material composition. Parts 42-45 may also comprise different materials or different material compositions.

According to an embodiment all of parts 42-45 are electrically and thermally conductive. According to another embodiment at least one of parts 42-45 is thermally conductive but not electrically conductive. However, parts 42-45 are still configured such that an electrically conductive connection between first electrode 10A and first substrate element 20 exists.

With respect to FIG. 5 an embodiment of an electronic device 500 is shown. The front side of electronic device 500 is not flat but comprises a step S, wherein according to an embodiment the step height may be less than 2 mm, in particular less than 1 mm, or less than 500 µm or less than 200 µm. A small step height may be advantageous when arranging heatsink 60 on the front side of the electronic device 500. According to an embodiment electronic device 500 may further comprise a montage hole 30B.

Note that in the embodiment depicted in FIG. 5 the encapsulant is configured such that only upper contact element surface 40A and leads 20A, 30A and 21A are exposed. In particular, second substrate element 30 is not exposed at encapsulant backside 50C. According to another embodiment second substrate element 30 is at least partially exposed.

Figure 6:
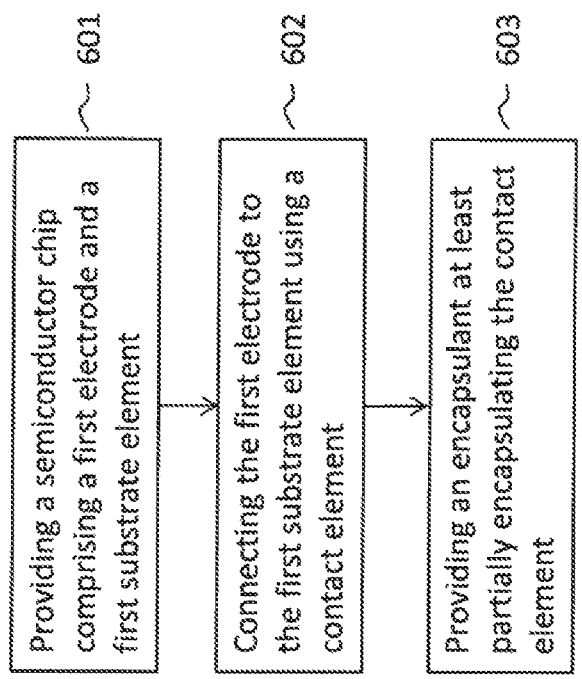
FIG. 6 shows a flow chart of an embodiment of a method for fabricating electronic devices.

With respect to FIG. 6 a flow chart of a method 600 for fabricating an electronic device is shown. Method 600 comprises steps 601-603. Step 601 comprises providing a semiconductor chip comprising a first electrode and providing a first substrate element. Step 602 comprises electrically connecting the first electrode to the first substrate element using a contact element. Step 603 comprises providing an encapsulant encapsulating the semiconductor chip, wherein the encapsulant is configured to at least partially expose the contact element. Method 600 may comprise an additional step, wherein the additional step comprises connecting a heatsink to the at least partially exposed contact clip.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, means, methods, or steps, presently existing or later to be developed, that perform substantially the same function or achieve substantially the same result as the corresponding embodiments described herein may be utilized according to the present invention. Accordingly, the appended claims are intended to include within their scope such processes, means, methods, or steps.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic through-hole device, comprising:
   a semiconductor chip comprising a first electrode on a first surface of the semiconductor chip;
   an encapsulant encapsulating the semiconductor chip;
   a first substrate element comprising a first outside contact configured for input in a through-hole contact of a printed circuit board; and
   a contact element configured to connect the first electrode to the first substrate element;
   wherein the encapsulant is configured to at least partially expose the contact element.

2. The electronic through-hole device of claim 1, further comprising a heatsink thermally connected to the contact element.

3. The electronic through-hole device of claim 2, wherein the heatsink is mechanically fixed on the contact element via one or more of a screw and a clamp.

4. The electronic through-hole device of claim 1, wherein the encapsulant comprises a step on a front-side of the encapsulant comprising the at least partially exposed contact element.

5. The electronic through-hole device of claim 1, wherein the contact element comprises a contact clip.

6. The electronic through-hole device of claim 5, wherein the contact clip is one contiguous part.

7. The electronic through-hole device of claim 5, wherein the contact clip comprises more than one part.

8. The electronic through-hole device of claim 1, wherein the first electrode is a source electrode or an emitter electrode.

9. The electronic through-hole device of claim 1, wherein the first substrate element comprises a first lead of the electronic through-hole device.

10. The electronic through-hole device of claim 1, wherein the first surface of the semiconductor chip comprises four edges and the contact element traverses at least two of the four edges.

11. The electronic through-hole device of claim 9, further comprising:
    a second electrode on a second surface of the semiconductor chip; and
    a second substrate element connected to the second electrode.

12. The electronic through-hole device of claim 11, wherein the second electrode is a drain electrode or a collector electrode.

13. The electronic through-hole device of claim 12, further comprising:
    a third electrode on the first surface of the semiconductor chip, wherein the third electrode is a gate electrode or a base electrode.

14. The electronic through-hole device of claim 13, further comprising:
    a second lead element electrically connected to the drain electrode; and
    a third lead element electrically connected to the gate electrode,
    wherein the first, second and third lead elements are configured for insertion in through-holes of a printed circuit board.

15. The electronic through-hole device of claim 1, wherein a surface of the encapsulant is coplanar with an at least partially exposed surface of the contact element.

16. An electronic through-hole device, comprising:
    a semiconductor chip comprising a first electrode on a first surface of the semiconductor chip;
    a first external connector element configured for input in a through-hole contact of an external component;
    a contact element configured to connect the first electrode to the first external connector element; and
    a heatsink connected to the contact element.

17. A method for fabricating an electronic through-hole device, the method comprising:
    providing a semiconductor chip comprising a first electrode on a first surface of the semiconductor chip;
    providing a first substrate element which comprises a first outside contact configured for input in a through-hole contact of an external component;
    electrically connecting the first electrode to the first substrate element using a contact element; and
    providing an encapsulant encapsulating the semiconductor chip, the encapsulant configured to at least partially expose the contact element.

18. The method of claim 17, further comprising grinding the encapsulant to at least partially expose the contact element.

19. The method of claim 17, wherein during encapsulation the encapsulant is applied such that the contact element remains at least partially exposed.

20. The method of claim 17, further comprising:
    connecting a heatsink to the partially exposed contact element.

* * * * *